(12) United States Patent
Canniff (10) Patent No.: US 11,008,655 B2
(45) Date of Patent: May 18, 2021

(54) COMPONENTS SUCH AS EDGE RINGS INCLUDING CHEMICAL VAPOR DEPOSITION (CVD) DIAMOND COATING WITH HIGH PURITY SP3 BONDS FOR PLASMA PROCESSING SYSTEMS

(71) Applicant: LAM RESEARCH CORPORATION, Fremont, CA (US)

(72) Inventor: Justin Charles Canniff, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 881 days.

(21) Appl. No.: 15/428,744

(22) Filed: Feb. 9, 2017

(65) Prior Publication Data

US 2017/0253974 A1 Sep. 7, 2017

Related U.S. Application Data (60) Provisional application No. 62/310,993, filed on Mar. 21, 2016, provisional application No. 62/303,091, filed on Mar. 3, 2016.

(51) Int. Cl.
*H01J 37/32* (2006.01)
*H01L 21/683* (2006.01)
*H01L 21/687* (2006.01)
*C23C 16/50* (2006.01)
*C23C 16/44* (2006.01)
*C23C 16/458* (2006.01)
*C23C 16/455* (2006.01)

(52) U.S. Cl.
CPC .......... *C23C 16/50* (2013.01); *C23C 16/4404* (2013.01); *C23C 16/455* (2013.01); *C23C 16/458* (2013.01); *C23C 16/4585* (2013.01); *H01J 37/32357* (2013.01); *H01J 37/32477* (2013.01); *H01J 37/32642* (2013.01); *H01J 37/32715* (2013.01); *H01L 21/6831* (2013.01); *H01L 21/68735* (2013.01); *H01L 21/68757* (2013.01)

(58) Field of Classification Search
CPC . C23C 16/4404; C23C 16/455; C23C 16/458; C23C 16/4585; C23C 16/50
USPC ................... 118/715–733; 156/345.1–345.55
See application file for complete search history.

(56) References Cited

U.S. PATENT DOCUMENTS

| | | | | |
|---|---|---|---|---|
| 5,190,823 A * | 3/1993 | Anthony | ............. | C23C 16/0272 423/446 |
| 5,952,060 A * | 9/1999 | Ravi | ....................... | C23C 16/26 118/722 |
| 6,605,352 B1 * | 8/2003 | Windischmann | ... | C02F 1/46109 428/332 |
| 2007/0208427 A1 * | 9/2007 | Davidson | ............ | A61F 2/30965 623/22.15 |
| 2013/0135058 A1 | 5/2013 | Long et al. | | |
| 2013/0313785 A1 * | 11/2013 | Otschik | ................ | F16J 15/3496 277/345 |

(Continued)

*Primary Examiner* — Charlee J. C. Bennett (57) ABSTRACT

A pedestal for a plasma processing system includes a substrate supporting surface. An annular edge ring is arranged around a periphery of the substrate supporting surface. A chemical vapor deposition (CVD) diamond coating is arranged on a plasma-exposed surface of the annular edge ring. The CVD diamond coating includes sp3 bonds. A purity of the sp3 bonds in the diamond coating is greater than 90%.

20 Claims, 5 Drawing Sheets

(56) References Cited

U.S. PATENT DOCUMENTS

2016/0172165 A1\* 6/2016 Jeon .................. H01J 37/32715
                                                    118/723 E \* cited by examiner

COMPONENTS SUCH AS EDGE RINGS INCLUDING CHEMICAL VAPOR DEPOSITION (CVD) DIAMOND COATING WITH HIGH PURITY SP3 BONDS FOR PLASMA PROCESSING SYSTEMS

CROSS-REFERENCE TO RELATED APPLICATIONS

This application claims the benefit of U.S. Provisional Application No. 62/303,091, filed on Mar. 3, 2016 and U.S. Provisional Application No. 62/310,993, filed on Mar. 21, 2016. The entire disclosures of the applications referenced above are incorporated herein by reference.

FIELD

The present disclosure relates to plasma processing systems for substrates, and more particularly to components such as edge rings that are used in processing chambers of plasma processing systems for substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition, etching and/or other treatment of substrates such as semiconductor wafers. A substrate may be arranged on a pedestal in a processing chamber of the substrate processing system. For example during etching or deposition, a gas mixture including one or more precursors is introduced into the processing chamber and plasma may be struck to etch the substrate or to deposit film on the substrate.

Edge rings have been used to adjust a profile of plasma near a radially outer edge of the substrate. For example in an etch process, the edge ring may be used to adjust an etch rate or etch profile. The edge ring is typically located on the pedestal around the radially outer edge of the substrate. Process conditions at the radially outer edge of the substrate can be modified by changing a position of the edge ring, a shape or profile of an inner edge of the edge ring, a height of the edge ring relative to an upper surface of the substrate, a material of the edge ring, etc.

Changing the edge ring usually requires the processing chamber to be opened, which is undesirable. In other words, an edge effect of the edge ring cannot be altered without opening the processing chamber. When the edge ring is eroded by plasma during etching, the edge effect changes.

Figure 1:
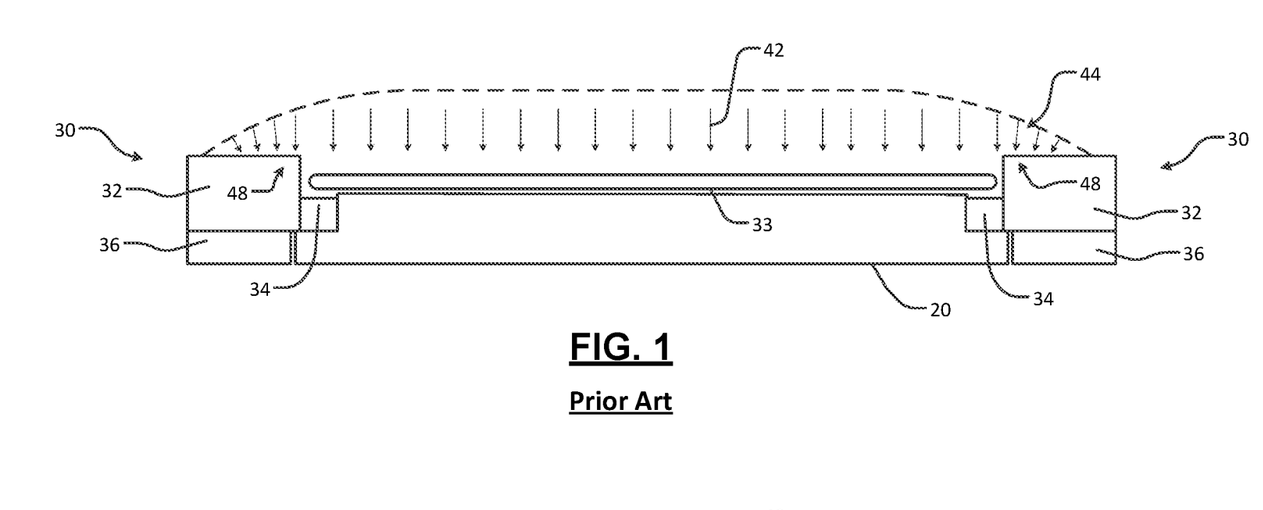
FIG. 1 is a side cross sectional view of a pedestal and an edge ring according to the prior art.
Figure 2:
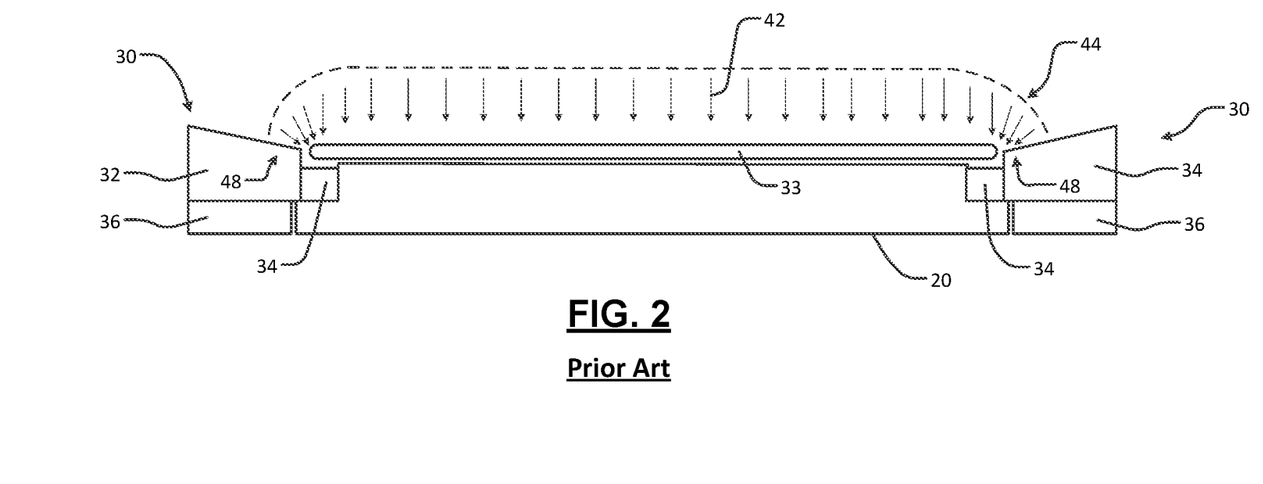
FIG. 2 is a side cross sectional view of a pedestal and an edge ring according to the prior art after the edge ring is eroded by plasma.

Referring now to FIGS. 1-2, a substrate processing system may include a pedestal 20 and an edge ring 30. The edge ring 30 may include one or more portions. In the example in FIGS. 1-2, the edge ring 30 includes a first annular portion 32 arranged near a radially outer edge of a substrate 33. A second annular portion 34 is located radially inwardly from the first annular portion below the substrate 33. A third annular portion 36 is arranged below the first annular portion 32. During use, plasma 42 is directed at the substrate 33 to etch the exposed portions of the substrate 33. The edge ring 30 is arranged to help shape the plasma such that uniform etching of the substrate 33 occurs.

In FIG. 2, after the edge ring 30 has been used, an upper surface of a radially inner portion of the edge ring 30 may exhibit erosion as identified at 48. As a result, plasma 42 may tend to etch a radially outer edge of the substrate 33 at a faster rate than etching of radially inner portions thereof as can be seen at 44.

Coatings have been used to improve erosion resistance of the edge ring and other components in the processing chamber. For example, a diamond-like carbon coating has been tested. However, the coating was etched very quickly by oxygen plasma. The semiconductor fabrication equipment industry has pursued other approaches for reducing edge ring erosion due to the high etch rate of diamond-like carbon coatings.

SUMMARY

A pedestal for a plasma processing system includes a substrate supporting surface. An annular edge ring is arranged around a periphery of the substrate supporting surface. A diamond coating is arranged on a plasma-exposed surface of the annular edge ring. The diamond coating includes sp3 bonds. A purity of the sp3 bonds in the diamond coating is greater than 90%.

In other features, the purity of the sp3 bonds in the diamond coating is greater than 95%. The purity of the sp3 bonds in the diamond coating is greater than 99%. The diamond coating is deposited on the annular edge ring using chemical vapor deposition (CVD).

A plasma processing system includes a processing chamber. The pedestal is arranged in the processing chamber. A plasma source creates plasma in the processing chamber. The plasma source includes a capacitively-coupled plasma (CCP) source. The plasma source includes an inductively-coupled plasma (ICP) source.

A plasma processing system includes a processing chamber. The pedestal is arranged in the processing chamber. A remote plasma source supplies plasma to the processing chamber.

A plasma processing system includes a processing chamber and a plasma source to one of supply plasma to the processing chamber and to create plasma in the processing chamber. At least one component arranged in the processing chamber includes a diamond coating. The diamond coating includes sp3 bonds. A purity of the sp3 bonds in the diamond coating is greater than 90%.

In other features, the purity of the sp3 bonds in the diamond coating is greater than 95%. The purity of the sp3 bonds in the diamond coating is greater than 99%. The diamond coating is deposited on the at least one component using chemical vapor deposition (CVD).

In other features, the at least one component is selected from a group consisting of an edge ring, a chamber wall, a gas distribution device, a gas injector, a window into the processing chamber, and an upper surface of a pedestal.

An edge ring for a plasma processing system includes an annular ring and a diamond coating arranged on a surface of the annular ring that is exposed to plasma during use. The diamond coating includes sp3 bonds. A purity of the sp3 bonds in the diamond coating is greater than 90%.

In other features, the purity of the sp3 bonds in the diamond coating is greater than 95%. The purity of the sp3 bonds in the diamond coating is greater than 99%. The diamond coating is deposited on the annular ring using chemical vapor deposition (CVD). The annular ring is made of a material selected from a group consisting of silicon (Si), silicon carbide (SiC) and silicon dioxide ($SiO_2$).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to an edge ring used in a plasma processing chamber. A plasma-facing surface of the edge ring is coated with a chemical vapor deposition (CVD) diamond coating. It is believed that the diamond-like carbon coatings described above failed in plasma applications due to a high concentration of sp2 bonds in the diamond-like carbon coatings. In some examples, the CVD diamond coating described herein includes high purity sp3 bonds. Having high purity sp3 bonds allows the CVD diamond coating to withstand plasma erosion for longer periods.

The high purity of sp3 bonds improves chamber performance and erosion resistance. Edge rings using the CVD diamond coating with high purity sp3 bonds have improved mean time between change (MTBC) due to the low plasma erosion rate of the coating. The CVD diamond coating can be etched cleanly, which reduces on-substrate defects. The CVD diamond coating also has high thermal conductivity, which improves etch uniformity at edges of the substrates. In some examples, the CVD diamond coating is supplied by Element Six Technologies U.S. Corporation, 3901 Burton Drive, Santa Clara, Calif. 95054, USA.

The edge ring may be used as a replacement for edge rings made of silicon silicon carbide (SiC), quartz, and other materials used for consumable components in a plasma processing chamber. In testing on some examples, the edge rings with the CVD diamond coating described herein had improved MTBC than edge rings using SiC without the CVD diamond coating and with no apparent residue. Due to the lower erosion rate and the use of primarily carbon, on-substrate defects are expected to be relatively low. The edge ring with the diamond coating will help equipment manufacturers meet next generation particle specs and improve MTBC.

Due to the lower erosion rate, a geometry of the edge rings can be maintained for a higher number of RF hours (RFHs), which allows greater process repeatability if customers want to maintain the same MTBC.

Although described with respect to edge rings, the principles of the present disclosure may also be implemented with other components of a substrate processing chamber. For example, components including, but not limited to, plasma confinement shrouds/rings, components of a showerhead or upper electrode, etc. may be coated with the CVD diamond coating.

Figure 3:
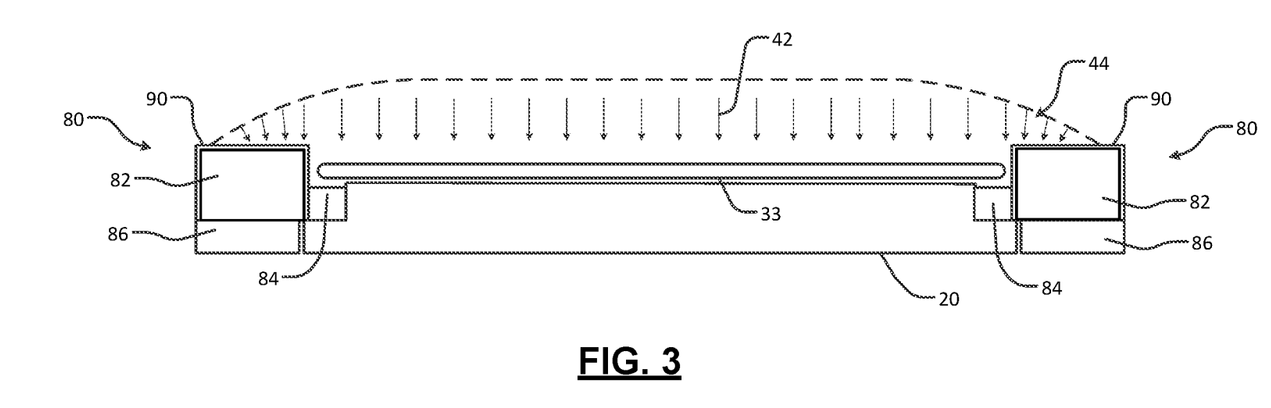
FIG. 3 is a side cross sectional view of an example of a pedestal and an edge ring including a CVD diamond coating with high purity sp3 bonds according to the present disclosure.

Referring now to FIG. 3, a substrate processing system may include a pedestal 20 and an edge ring 80. The edge ring 80 may include a single piece or two or more portions. In the example in FIG. 3, the edge ring 80 includes a first annular portion 82 that is arranged near a radially outer edge of a substrate 33 (or near a substrate supporting surface of the pedestal 20). A second annular portion 84 is located radially inwardly from the first annular portion below the substrate 33. A third annular portion 86 is arranged below the first annular portion 82.

While a cross-sectional shape of the first annular portion 82 of the edge ring 80 is shown as a rectangle, cross sections having other shapes may be used. In some examples, the edge ring is made of a material selected from a group consisting of silicon (Si), silicon carbide (SiC) and silicon dioxide ($SiO_2$). While specific edge ring materials are disclosed herein, other materials can be used.

The first annular portion 82 of the edge ring 80 includes a diamond coating 90. In some examples, the diamond coating is deposited using chemical vapor deposition (CVD). In some examples, the diamond coating has a thickness of 1 μm to 1 mm. In other examples, the diamond coating has a thickness of 100 μm to 1 mm. In other examples, the diamond coating has a thickness of 250 μm to 1 mm. In some examples, the purity of sp3 bonds is greater than 90%. In other examples, the purity of the sp3 bonds is greater than 95%. In other examples, the purity of the sp3 bonds is greater than 99%. In other examples, the purity of the sp3 bonds is greater than 99.5% (e.g. >99.85%).

While the diamond coating 90 is shown on plasma-facing surfaces of the first annular portion 82, the diamond coating 90 may also be deposited on plasma-facing surfaces or an entire outer surface of the first, second and third annular portions 82, 84 and 86.

During use, plasma 42 is directed at the substrate 33 to etch the exposed portions of the substrate 33. The edge ring 80 is arranged to help shape the plasma such that uniform etching of the substrate 33 occurs.

Although described herein as being applied to the edge ring 80, the coating of the present disclosure may be applied to other components of a substrate processing system (e.g., components of a substrate processing chamber where plasma etch and/or deposition processes are performed). For example only, the coating of the present disclosure may be applied to components including, but not limited to, edge rings, windows (e.g., RF windows, dielectric windows, etc.), injectors, liners, chamber walls, and various components of the pedestal/pedestal (e.g., a chuck, such as an electrostatic chuck).

Figure 4:
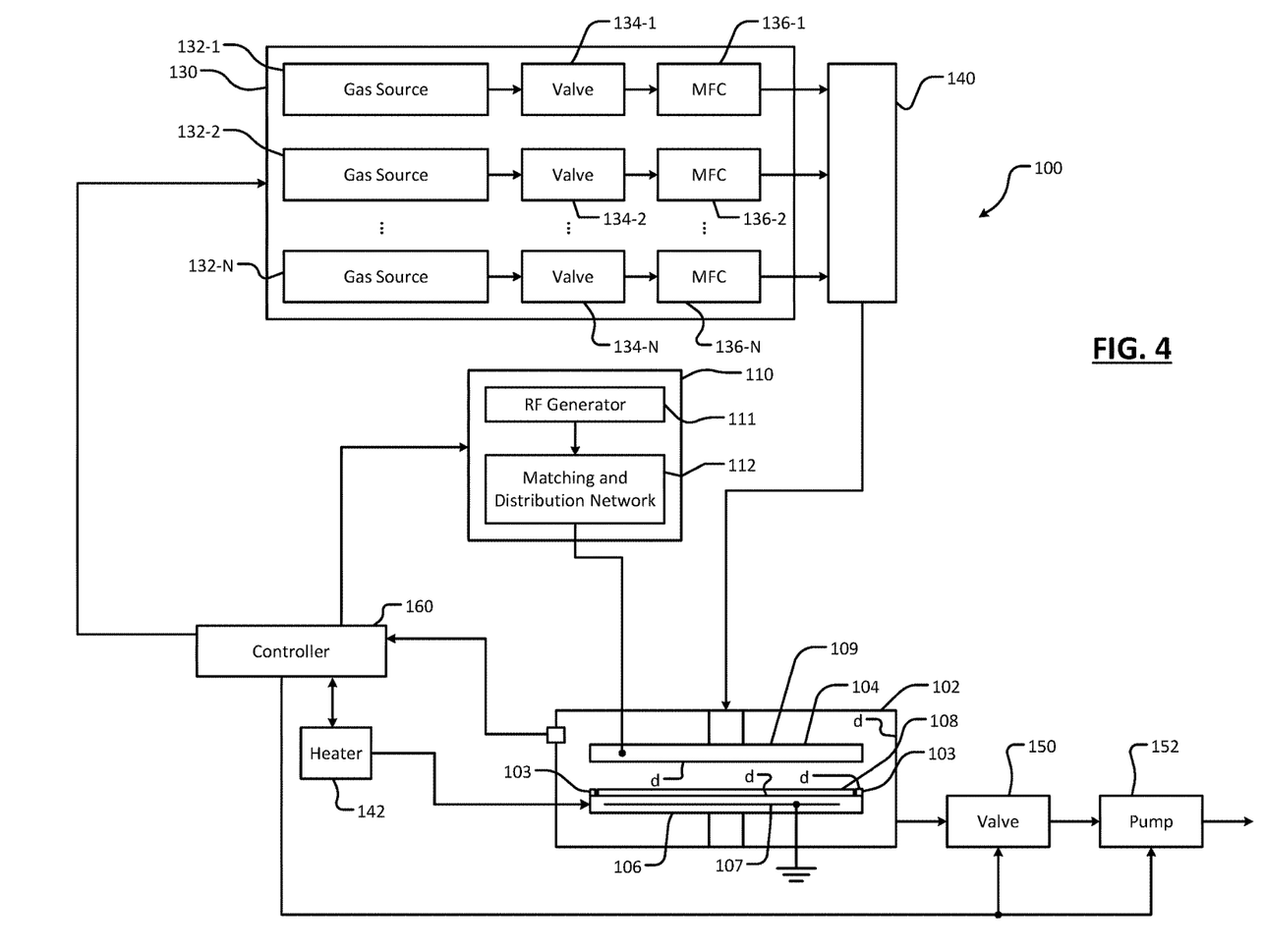
FIGS. 4-6 are functional block diagrams of various substrate processing systems including a processing chamber and at least one component with a diamond coating with high purity sp3 bonds located in the processing chamber.

Referring now to FIG. 4, an example of a substrate processing system 100 for performing etching using RF plasma is shown. Examples of various components in the substrate processing system 100 that may be coated with the diamond coating (identified by "d" in FIG. 4) as described above are shown. The substrate processing system 100 includes a processing chamber 102 that encloses other components of the substrate processing system 100 and contains the RF plasma. In some examples, inner wall surfaces of the processing chamber 102 are coated with the diamond coating d. The substrate processing system 100 includes an upper electrode 104 and a pedestal 106 including a lower electrode 107. In some examples, the upper electrode is coated with the diamond coating d. In some examples, one or more surfaces of the pedestal 106 are coated with the diamond coating d. An edge ring 103 is supported by the pedestal 106 and is arranged around the substrate 108. In some examples, the edge ring 103 is coated with the diamond coating d. During operation, a substrate 108 is arranged on the pedestal 106 between the upper electrode 104 and the lower electrode 107.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode 104 and the lower electrode 107. The other one of the upper electrode 104 and the lower electrode 107 may be DC grounded, AC grounded or floating. For example only, the RF generating system 110 may include an RF voltage generator 111 that generates the RF voltage that is fed by a matching and distribution network 112 to the upper electrode 104 or the lower electrode 107. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106. The heater 142 may be used to control a temperature of the pedestal 106 and the substrate 108. A valve 150 and pump 152 may be used to evacuate reactants from the processing chamber 102. A controller 160 may be used to control components of the substrate processing system 100.

Figure 5:
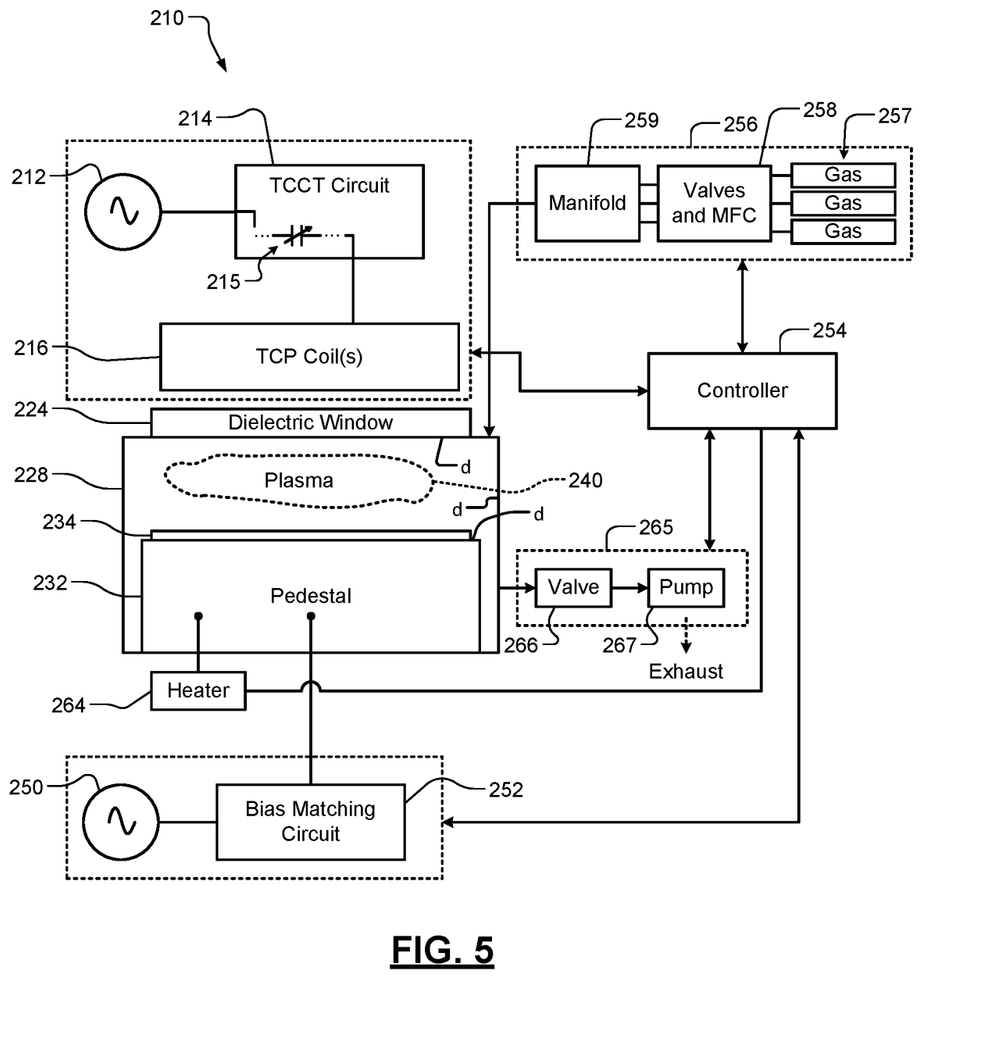

Referring now to FIG. 5, an example of a substrate processing system 210 according to the present disclosure is shown. Various components in the substrate processing system 210 may be coated with the diamond coating d as described above. The substrate processing system 210 includes an RF source 212 connected to a transformer-coupled capacitive tuning (TCCT) circuit 214, which is connected to TCP coils 216. The TCCT circuit 214 typically includes one or more fixed or variable capacitors 215. An example of a TCCT circuit 214 is shown and described in commonly assigned U.S. Publication No. 2013/0135058 to Long et al., which is hereby incorporated by reference in its entirety. The TCP coils 216 may include a pair of coils or an inner coil pair and an outer coil pair.

The TCP coils 216 are arranged adjacent to a dielectric window 224. In some examples, one or more surfaces of the dielectric window 224 are coated with the diamond coating. The dielectric window 224 is arranged along one side of a processing chamber 228. In some examples, inner wall surfaces of the processing chamber 228 are coated with the diamond coating d. The processing chamber 228 further comprises a pedestal 232 that supports a substrate 234. In some examples, one or more surfaces of the pedestal 232 are coated with the diamond coating d. In some examples, the pedestal 232 includes an edge ring (not shown) that is coated with the diamond coating as described above. The pedestal 232 may include an electrostatic chuck, a mechanical chuck or other type of chuck. Plasma 240 is generated inside of the processing chamber 228. The plasma 240 etches an exposed surface of the substrate 234. An RF source 250 and a bias matching circuit 252 may be used to bias the pedestal 232 during operation.

A gas delivery system 256 may be used to supply a gas mixture to the processing chamber 228. The gas delivery system 256 may include process gas sources 257, a metering system 258 such as valves and mass flow controllers, and a manifold 259. A heater 264 may be used to heat the pedestal 232 to a predetermined temperature. An exhaust system 265 includes a valve 266 and pump 267 to remove reactants from the processing chamber 228 by purging or evacuation.

A controller 254 may be used to control the etching process. The controller 254 monitors system parameters and controls delivery of the gas mixture, striking, maintaining and extinguishing the plasma, removal of reactants, supply of cooling gas, etc.

Figure 6:
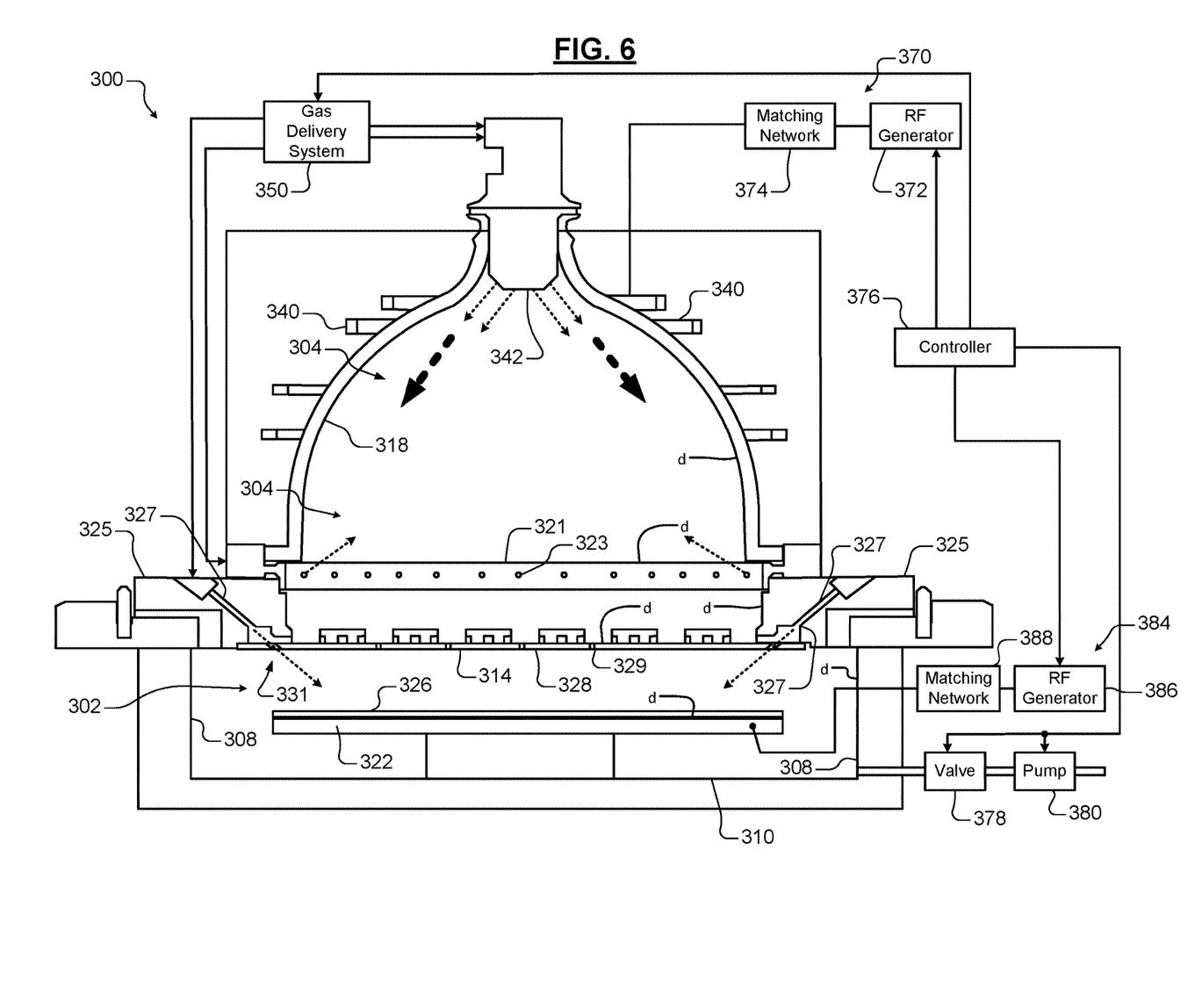

Referring now to FIG. 6, a substrate processing chamber 300 for etching or ashing a substrate according to the present disclosure is shown. Various components in the substrate processing chamber 300 may be coated with the diamond coating d as described above. While a specific type of substrate processing chamber is shown and described, the improvements described herein may be applied to a variety of other substrate processing chambers.

The substrate processing chamber 300 includes a lower chamber region 302 and an upper chamber region 304. The lower chamber region 302 is defined by chamber sidewall surfaces 308, a chamber bottom surface 310 and a lower surface of a gas distribution device 314. In some examples, one or more surfaces of the gas distribution device 314 are coated with the diamond coating.

The upper chamber region 304 is defined by an upper surface of the gas distribution device 314 and an inner surface 318 of the upper chamber region 304. In some examples, inner wall surfaces of the upper and lower chambers are coated with a diamond coating d. In some examples, the upper chamber region 304 may have a dome shape, although other shapes can be used. In some examples, the upper chamber region 304 rests on a first support 321. In some examples, the first support 321 has an annular shape. In some examples, the first support 321 includes one or more gas flow channels 323 for delivering process gas to the upper chamber region 304, as will be described further below. In some examples, the process gas is delivered by the one or more gas flow channels 323 in an upward direction at an acute angle relative to a plane including the gas distribution device 314, although other angles/directions may be used. In some examples, the gas flow channels 323 are uniformly spaced around the first support 321.

The first support 321 may rest on a second support 325. In some examples, the first and second supports are coated with the diamond coating. In some examples, the second support has an annular shape. The second support 325 defines one or more gas flow channels 327 for delivering process gas to the lower chamber region 302. In some examples, the gas flow channels are uniformly spaced around the second support 325. In some examples, gas through holes 331 in the gas distribution device 314 align with the gas flow channels 327. In other examples, the gas distribution device 314 has a smaller diameter and the gas through holes 331 are not needed. In some examples, the process gas is delivered by the one or more gas flow channels 327 in a downward direction towards the substrate at an acute angle relative to the plane including the gas distribution device 314, although other angles/directions may be used.

In other examples, the upper chamber region 304 is cylindrical with a flat top surface and a flat inductive coil may be used. In still other examples, a single chamber may be used with a spacer located between a showerhead and the pedestal.

A pedestal 322 is arranged in the lower chamber region 302. In some examples, the pedestal 322 includes an electrostatic chuck (ESC), although other types of pedestals can be used. A substrate 326 is arranged on an upper surface of the pedestal 322 during etching. In some examples, one or more surfaces of the pedestal are coated with the diamond coating. In some examples, a temperature of the substrate 326 may be controlled by a heater plate, an optional cooling plate with fluid channels and one or more sensors (all not shown); although any other suitable pedestal temperature control system may be used.

In some examples, the gas distribution device 314 includes a showerhead (for example, a plate 328 having a plurality of through holes 329). The plurality of through holes 329 extend from the upper surface of the plate 328 to the lower surface of the plate 328. In some examples, the through holes 329 have a diameter in a range from 0.4" to 0.75" and the showerhead is made of a conducting material such as aluminum or a non-conductive material such as ceramic with an embedded electrode made of a conducting material.

One or more inductive coils 340 are arranged around an outer portion of the upper chamber region 304. When energized, the one or more inductive coils 340 create an electromagnetic field inside of the upper chamber region 304. A gas injector 342 injects one or more gas mixtures from a gas delivery system 350. In some examples, the gas injector 342 includes a center injection location that directs gas in a downward direction and one or more side injection locations that inject gas at an angle with respect to the downward direction. In some examples, an exposed surface of the gas injector 342 is coated with the diamond coating. In some examples, the gas delivery system 350 delivers a first portion of the gas mixture at a first flow rate to the center injection location and a second portion of the gas mixture at a second flow rate to the side injection location(s) of the gas injector 342. In other examples, different gas mixtures are delivered by the gas injector 342. In some examples, the gas delivery system 350 delivers tuning gas to the gas flow channels 323 and 327 and/or to other locations in the processing chamber as will be described below. In some examples, the tuning gas is varied to adjust etch or ash rates and/or selectivity by varying a location of the volume of ionized species.

A plasma generator 370 may be used to generate RF power that is output to the one or more inductive coils 340. Plasma is generated in the upper chamber region 304. In some examples, the plasma generator 370 includes an RF generator 372 and a matching network 374. The matching network 374 matches an impedance of the RF generator 372 to the impedance of the one or more inductive coils 340. In some examples, the gas distribution device 314 is connected to a reference potential such as ground. A valve 378 and a pump 380 may be used to control pressure inside of the lower and upper chamber regions 302, 304 and to evacuate reactants from the lower and upper chamber regions 302, 304, respectively.

A controller 376 communicates with the gas delivery system 350, the valve 378, the pump 380, and/or the plasma generator 370 to control flow of process gas, purge gas, RF plasma and chamber pressure. In some examples, plasma is sustained inside the upper chamber region 304 by the one or more inductive coils 340. One or more gas mixtures are introduced from a top portion of the chamber using the gas injector 342 and plasma is confined within the upper chamber region 304 using the gas distribution device 314, which may be grounded.

Confining the plasma in the upper chamber region 304 allows volume recombination of plasma species and effusing desired etchant species through the gas distribution device 314. In some examples, there is no RF bias applied to the substrate 326. As a result, there is no active sheath on the substrate 326 and ions are not hitting the substrate with any finite energy. Some amount of ions will diffuse out of the plasma region through the gas distribution device 314. However, the amount of plasma that diffuses is an order of magnitude lower than the plasma located inside the upper chamber region 304. Most of ions in the plasma are lost by volume recombination at high pressures. Surface recombination loss at the upper surface of the gas distribution device 314 also lowers ion density below the gas distribution device 314.

In other examples, an RF bias generator 384 is provided and includes an RF generator 386 and a matching network 388. The RF bias can be used to create plasma between the gas distribution device 314 and the pedestal or to create a self-bias on the substrate 326 to attract ions. The controller 376 may be used to control the RF bias.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A pedestal for a plasma processing system, comprising:
a substrate supporting surface;
an annular edge ring arranged around a periphery of the substrate supporting surface; and
a diamond coating arranged on a plasma-exposed surface of the annular edge ring,
wherein the diamond coating includes sp3 bonds, and
wherein a purity of the sp3 bonds in the diamond coating is greater than 99%.

2. The pedestal of claim 1, wherein the diamond coating is deposited on the annular edge ring using chemical vapor deposition (CVD).

3. A plasma processing system comprising:
a processing chamber, wherein the pedestal of claim 1 is arranged in the processing chamber; and
a plasma source to create plasma in the processing chamber.

4. The plasma processing system of claim 3, wherein the plasma source includes a capacitively-coupled plasma (CCP) source.

5. The plasma processing system of claim 3, wherein the plasma source includes an inductively-coupled plasma (ICP) source.

6. A plasma processing system comprising:
a processing chamber, wherein the pedestal of claim 1 is arranged in the processing chamber; and
a remote plasma source to supply plasma to the processing chamber.

7. A plasma processing system, comprising:
a processing chamber;
a plasma source to one of supply plasma to the processing chamber and create plasma in the processing chamber; and
at least one component arranged in the processing chamber including a diamond coating,
wherein the diamond coating includes sp3 bonds, and
wherein a purity of the sp3 bonds in the diamond coating is greater than 99%.

8. The plasma processing system of claim 7, wherein the diamond coating is deposited on the at least one component using chemical vapor deposition (CVD).

9. The plasma processing system of claim 7, wherein the at least one component is selected from a group consisting of:
an edge ring;
a chamber wall;
a gas distribution device;
a gas injector;
a window into the processing chamber; and
an upper surface of a pedestal.

10. An edge ring for a plasma processing system, comprising:
an annular ring; and
a diamond coating arranged on a surface of the annular ring that is exposed to plasma during use,
wherein the diamond coating includes sp3 bonds, and
wherein a purity of the sp3 bonds in the diamond coating is greater than 99%.

11. The edge ring of claim 10, wherein the diamond coating is deposited on the annular ring using chemical vapor deposition (CVD).

12. The edge ring of claim 10, wherein the annular ring is made of a material selected from a group consisting of silicon (Si), silicon carbide (SiC) and silicon dioxide ($SiO_2$).

13. The edge ring of claim 10, wherein the diamond coating has a thickness of 1 μm to 1 mm.

14. The edge ring of claim 10, wherein the diamond coating has a thickness of 100 μm to 1 mm.

15. A component for a plasma processing system, comprising:
a surface that is exposed to plasma during use of the plasma processing system; and
a diamond coating arranged on the surface of the component,
wherein the diamond coating includes sp3 bonds, and
wherein a purity of the sp3 bonds in the diamond coating is greater than 99%.

16. The component of claim 15, wherein the diamond coating is deposited on the component using chemical vapor deposition (CVD).

17. The component of claim 15, wherein the component is made of a material selected from a group consisting of silicon (Si), silicon carbide (SiC) and silicon dioxide ($SiO_2$).

18. The component of claim 15, wherein the diamond coating has a thickness of 1 μm to 1 mm.

19. The component of claim 15, wherein the diamond coating has a thickness of 100 μm to 1 mm.

20. The component of claim 15, wherein the component is selected from a group consisting of:
an edge ring;
a chamber wall;
a gas distribution device;
a gas injector;
a window into a processing chamber; and
an upper surface of a pedestal.

\* \* \* \* \*